United States Patent
Zhang et al.

(10) Patent No.: US 11,024,959 B2
(45) Date of Patent: Jun. 1, 2021

(54) SIGNAL TRANSMISSION APPARATUS AND SYSTEM

(71) Applicant: Huawei Technologies Co., Ltd., Shenzhen (CN)

(72) Inventors: Shasha Zhang, Shanghai (CN); Lijun Pu, Shanghai (CN); Jinsong Zhang, Shanghai (CN)

(73) Assignee: Huawei Technologies Co., Ltd., Shenzhen (CN)

(*) Notice: Subject to any disclaimer, the term of this patent is extended or adjusted under 35 U.S.C. 154(b) by 0 days.

(21) Appl. No.: 16/878,275

(22) Filed: May 19, 2020

(65) Prior Publication Data

US 2020/0280130 A1    Sep. 3, 2020

Related U.S. Application Data

(63) Continuation of application No. PCT/CN2017/111829, filed on Nov. 20, 2017.

(51) Int. Cl.
| | |
|---|---|
| *H01Q 3/26* | (2006.01) |
| *H01Q 1/52* | (2006.01) |
| *H01Q 3/28* | (2006.01) |
| *H01Q 3/36* | (2006.01) |

(52) U.S. Cl.
CPC ........... *H01Q 3/2664* (2013.01); *H01Q 1/526* (2013.01); *H01Q 3/28* (2013.01); *H01Q 3/36* (2013.01)

(58) Field of Classification Search
CPC .......... H01Q 3/2664; H01Q 3/36; H01Q 3/28; H01Q 1/526; H04B 17/3912; H04B 17/318; H04B 17/0085; H04B 17/29; H04B 17/15
See application file for complete search history.

(56) References Cited

U.S. PATENT DOCUMENTS

| | | | |
|---|---|---|---|
| 10,069,189 B2 * | 9/2018 | Chen | G06F 13/4063 |
| 2006/0006881 A1 | 1/2006 | Hernandez et al. | |
| 2012/0214415 A1 * | 8/2012 | Harvey | H05K 7/1425 |
| | | | 455/41.2 |
| 2014/0141726 A1 | 5/2014 | Schlub et al. | |

FOREIGN PATENT DOCUMENTS

| | | |
|---|---|---|
| CN | 1614979 A | 5/2005 |
| CN | 101207447 A | 6/2008 |
| CN | 104749451 A | 7/2015 |

(Continued)

*Primary Examiner* — Lam T Mai
(74) *Attorney, Agent, or Firm* — Slater Matsil, LLP

(57) ABSTRACT

A signal transmission apparatus includes: a shielding cabinet and at least one group of first signal transceiver assemblies, at least one antenna assembly, and a first installation structure that are disposed inside the shielding cabinet, where the first installation structure has a one-to-one correspondence with the at least one group of first signal transceiver assemblies, each antenna assembly includes an antenna probe and a signal cable that are connected to each other, and the antenna probe performs, by using the signal cable, signal transmission with another signal transmission apparatus disposed outside the shielding cabinet; signal transmission is performed between the first signal transceiver assembly and the antenna probe in a wireless manner; and each first installation structure can drive a corresponding group of first signal transceiver assemblies to move.

18 Claims, 5 Drawing Sheets

(56) References Cited

FOREIGN PATENT DOCUMENTS

| | | |
|---|---|---|
| CN | 104931811 A | 9/2015 |
| CN | 204705678 U | 10/2015 |
| CN | 105375994 A | 3/2016 |
| CN | 107145811 A | 9/2017 |
| CN | 207264394 U | 4/2018 |
| EP | 3293898 A1 | 3/2018 |
| JP | 2011095221 A | 5/2011 |
| WO | 2016176968 A1 | 11/2016 |

* cited by examiner

SIGNAL TRANSMISSION APPARATUS AND SYSTEM

CROSS-REFERENCE TO RELATED APPLICATIONS

This application is a continuation of International Application No. PCT/CN2017/111829, filed on Nov. 20, 2017, the disclosure of which is hereby incorporated by reference in its entirety

TECHNICAL FIELD

This application relates to the field of communications technologies, and in particular, to a signal transmission apparatus and system

BACKGROUND

As wireless communication develops, spectrum resources become scarce resources for development of modern mobile communication. In addition, a millimeter wave has characteristics of a wide frequency band and abundant available resources, and a large carrier bandwidth of hundreds Mb can be used to carry a large amount of data information. Therefore, using a high-frequency antenna to implement high-speed transmission of a signal is an inevitable trend for development of a 5th generation (5G) mobile communications technology. However, during application of a high-frequency millimeter wave, an energy loss of the high-frequency millimeter wave when the high-frequency millimeter wave is propagated in air cannot be ignored. For example, according to a free space loss formula: space loss=$20*\lg(\text{frequency})+20*\lg(\text{transmission distance})+32.4$, it can be learned that: When millimeter waves are propagated in paths of a same distance, a difference between a loss of a millimeter wave in the 28 GHz (Giga Hertz) frequency band and a loss of a millimeter wave in each of the 1.8 GHz, 2.1 GHz, and 3.5 GHz frequency bands is respectively 23.8 dB (decibel), 22.5 dB, and 18.1 dB; and when millimeter waves are propagated in paths of a same distance, a difference between a loss of a millimeter wave in the 39 GHz frequency band and a loss of a millimeter wave in each of the 1.8 GHz, 2.1 GHz, and 3.5 GHz frequency bands is respectively 26.7 dB, 25.4 dB, and 20.1 dB. That when millimeter waves are propagated in paths of a same distance, a difference between a loss of a millimeter wave in the 28 GHz frequency band and a loss of a millimeter wave in the 2.1 GHz frequency band is 22.5 dB means that a space attenuation loss of the millimeter wave in the 28 GHz frequency band for 100 meters is equivalent to a loss of the millimeter wave in the 2.1 GHz frequency band for 1300 meters.

To resolve this problem, in the related art, a plurality of antennas are integrated into a chip with a relatively small area (for example, 10 centimeters*10 centimeters) to form an antenna in package, to improve an integration level of the antenna, and reduce a path loss of a signal in a transmission process. In addition, an arrangement of the antenna in package can simplify a system design and reduce costs. Therefore, applying the antenna in package to 5G and implementing high-speed signal transmission by using the high-frequency antenna is an inevitable trend of 5G development.

A virtual field in an air interface test is a scenario similar to a real wireless transmission scenario that is constructed in a lab environment. In other words, a radio signal sent by a baseband unit is received in the lab environment, an amplitude and a phase of the radio signal are processed, and then the processed radio signal is sent to a terminal. Because the virtual field has characteristics such as controllable and repeatable environment changes, a researcher usually tests a wireless network in the virtual field to evaluate network performance. For example, in the virtual field, key performance indicators (KPI) of the network such as accessibility, retainability, mobility, or a throughput are tested.

Testing the wireless network in a plurality of scenarios by using the virtual field is a problem that needs to be solved.

SUMMARY

This application provides a signal transmission apparatus and system, to improve accuracy of a virtual field test and completeness of a test scenario. The technical solutions are as follows:

According to a first aspect, a signal transmission apparatus is provided. The signal transmission apparatus includes: a shielding cabinet and at least one group of first signal transceiver assemblies, at least one antenna assembly, and a first installation structure that are disposed inside the shielding cabinet, where the first installation structure has a one-to-one correspondence with the at least one group of first signal transceiver assemblies, each antenna assembly includes an antenna probe and a signal cable that are connected to each other, and the antenna probe performs, by using the signal cable, signal transmission with another signal transmission apparatus disposed outside the shielding cabinet; signal transmission is performed between the first signal transceiver assembly and the antenna probe in a wireless manner; and each first installation structure can drive a corresponding group of first signal transceiver assemblies to move.

It should be noted that, when the first signal transceiver assembly moves when driven by the first installation structure, strength and a phase of a signal received or sent by the first signal transceiver assembly change correspondingly. Therefore, a scenario in which strength and a phase of a signal change because the first signal transceiver assembly moves in a real network may be simulated, and a scenario in which the first signal transceiver assembly performs beam switching in a cell and that is simulated due to a signal change is constructed, so that a plurality of scenarios may be provided for a virtual field test, and accuracy of the virtual field test and completeness of the test scenario are improved.

In addition, according to the signal transmission apparatus provided in this application, an air interface (that is, a virtual radio channel) for signal transmission can be formed by using real space of the shielding cabinet, to provide a condition for signal transmission in the shielding cabinet, so that the antenna probe can obtain, by using the real space, a signal transmitted by the first signal transceiver assembly, and send the signal to the another signal transmission apparatus disposed outside the shielding cabinet. Further, a coverage scenario of a signal on a real cell is simulated, and signal introduction and transmission in a virtual field can be implemented without a radio frequency port. Therefore, a problem that a signal cannot be introduced by using a feeder and a virtual field test cannot be performed on an antenna in package because a radio frequency port cannot be disposed on the antenna in package is resolved.

In a possible implementation, each first installation structure includes a fixed piece and an active piece, the fixed piece is fixedly connected to the shielding cabinet, one end of the active piece is actively connected to the fixed piece, and the other end is fixedly connected to the corresponding group of first signal transceiver assemblies; the active piece can move horizontally; and/or the active piece can move vertically; and/or the active piece can rotate around a reference axis parallel to a vertical direction; and/or the active piece can rotate around a reference axis parallel to a horizontal direction.

Further, signal attenuation may occur in a transmission process of a signal, and an attenuation degree of the signal is positively correlated to a transmission distance. Therefore, to reduce impact of different attenuation degrees of signals on a test result, a distance from any antenna probe to any first signal transceiver assembly is within a preset distance range, to improve accuracy of the virtual field test.

Optionally, a distance from each antenna probe to a target point is equal, and the target point is a geometric center of a graph enclosed by using an installation point of each of the at least one group of first signal transceiver assemblies as a vertex.

In addition, the signal transmission apparatus further includes a second installation structure disposed inside the shielding cabinet, where the second installation structure has an installation surface, a distance from any point on the installation surface to the target point is equal, and each antenna probe is installed on the installation surface.

When the distance from any point on the installation surface to the target point is equal, a signal attenuation degree of each signal in the transmission process can be further ensured to be the same as much as possible, to reduce the impact of the signal attenuation degrees on the test result.

In a possible implementation of the installation surface, the installation surface is a curved surface, and a generatrix of the curved surface is an arc that uses the target point as a circle center.

In another possible implementation of the installation surface, the installation surface is a hemispherical surface, and a sphere center of the hemispherical surface is a position of the target point.

Optionally, the signal transmission apparatus further includes a first mobile assembly having a one-to-one correspondence with the at least one antenna assembly, where one end of each first mobile assembly is connected to the second installation structure, the other end of each first mobile assembly is connected to a corresponding antenna probe, and each first mobile assembly is configured to drive the corresponding antenna probe to move relative to the second installation structure, to help adjust, in a test process, a position of the antenna probe based on an actual requirement.

In a possible implementation of the first mobile assembly, each first mobile assembly is a connecting rod assembly or a rocker arm assembly.

In another possible implementation of the first mobile assembly, each first mobile assembly includes a sliding guide rail and a sliding portion, the sliding guide rail is fixedly connected to the second installation structure, one end of the sliding portion is clamped into the sliding guide rail, and the other end of the sliding portion is fixedly connected to the corresponding antenna probe.

Optionally, the signal transmission apparatus further includes a second mobile assembly, one end of the second mobile assembly is connected to the second installation structure, the other end of the second mobile assembly is connected to the shielding cabinet, and the second mobile assembly is configured to drive the second installation structure to move in the shielding cabinet, and therefore, each antenna probe on the installation surface of the second installation structure is driven to move to a corresponding position.

A signal received by the antenna probe has a signal amplitude and a signal phase, and the antenna probe is configured to perform, by using the signal cable, signal transmission with the another signal transmission apparatus disposed outside the shielding cabinet. Therefore, the position of the antenna probe can reflect a position of the another signal transmission apparatus in the network. Correspondingly, by adjusting the position of the antenna probe by using the first mobile assembly and the second mobile assembly, a beam switching scenario formed, in the real network, because the another signal transmission apparatus moves can be simulated. Therefore, in an actual test process, for example, when the real network is analyzed or modeled, or when a function implemented by a product such as an antenna in package is analyzed, the position of the antenna probe may be adjusted based on test content, to simulate the beam switching scenario, and the completeness of the virtual field test scenario is improved.

Optionally, each antenna probe is any one of a directional dual-polarized antenna, a directional single-polarized antenna, an omnidirectional dual-polarized antenna, or an omnidirectional single-polarized antenna.

When the antenna probe is a dual-polarized antenna, two antennas, in the antenna, whose polarization directions are mutually orthogonal can simultaneously work in a transmit/receive duplex mode, so that a quantity of antennas disposed in the signal transmission apparatus can be reduced.

Optionally, a signal processing assembly is further serially connected to each signal cable. Processing a signal by using the signal processing assembly can simulate a change of a signal in a real transmission process, so that a signal received by the another signal transmission apparatus is closer to the signal in the real transmission process, and a similarity between the signal and a signal in an actual mobile communications network is improved, to further improve accuracy of the virtual field test.

For example, the signal processing assembly is a signal amplitude-phase controller, a channel emulator, or a signal amplitude controller.

The signal amplitude-phase controller serially connected to each signal cable is configured to adjust an amplitude and a phase of a signal transmitted on the signal cable.

The channel emulator serially connected to each signal cable is configured to configure a channel parameter of a signal transmitted on the signal cable.

The signal amplitude controller serially connected to each signal cable is configured to adjust an amplitude of a signal transmitted on the signal cable.

Optionally, a wave-absorbing material is coated inside the shielding cabinet. The wave-absorbing material is coated inside the shielding cabinet, and a signal transmitted to an inner wall of the shielding cabinet is absorbed by using the wave-absorbing material, so that the signal transmitted to the inner wall may be prevented from being reflected, and a quality of a signal transmitted inside the shielding cabinet is ensured.

Optionally, the first signal transceiver assembly includes at least one antenna in package, and the another signal transmission apparatus includes a terminal or a spectrum analyzer. In this case, the antenna in package may send a signal to the antenna probe in a wireless manner, and the antenna probe sends the signal to the terminal or the spectrum analyzer, and the signal transmitted by the antenna in package can be tested by detecting the signal received by the terminal or the spectrum analyzer. Alternatively, when the first signal transceiver assembly includes at least one antenna in package, and the another signal transmission apparatus includes a terminal, the terminal can exchange signals with the antenna in package by using the antenna probe, and a received signal is tested at a receive end of the signal, to test a signal sent by a transmit end of the signal.

Optionally, each group of first signal transceiver assemblies includes three antennas in package.

When the first installation structure drives the three antennas in package to move, and the antenna in package is configured to send a signal to the antenna probe, strength and a phase of the signal sent by the antenna in package change, so that a scenario in which a signal is handed over between cells due to a signal change may be constructed, and a plurality of scenarios are provided for the virtual field test.

Optionally, the first signal transceiver assembly includes at least one terminal, and the another signal transmission apparatus includes an antenna in package.

According to a second aspect, a signal transmission system is provided. The signal transmission system includes the signal transmission apparatus according to any implementation of the first aspect.

Optionally, the signal transmission system includes a first signal transmission apparatus and a second signal transmission apparatus. For a structure of the first signal transmission apparatus and a structure of the second signal transmission apparatus, refer to a structure of the signal transmission apparatus according to any implementation of the first aspect. A first signal transceiver assembly in the first signal transmission apparatus includes at least one antenna in package, and a first signal transceiver assembly in the second signal transmission apparatus includes at least one terminal.

Optionally, the signal transmission system includes a first signal transmission apparatus and a second signal transmission apparatus. For a structure of the first signal transmission apparatus, refer to a structure of the signal transmission apparatus according to any implementation of the first aspect. A first signal transceiver assembly in the first signal transmission apparatus includes at least one antenna in package, and the second signal transmission apparatus is a terminal or a spectrum analyzer.

According to the signal transmission apparatus and system provided in the embodiments of this application, the first installation structure drives the corresponding group of first signal transceiver assemblies to move, so that strength and the phase of the signal received or sent by the first signal transceiver assembly change correspondingly. Therefore, a scenario in which strength and a phase of a signal change because the first signal transceiver assembly moves in a real network may be simulated, and a scenario in which the first signal transceiver assembly performs beam switching in a cell and that is simulated due to a signal change is constructed, so that a plurality of scenarios may be provided for the virtual field test, and accuracy of the virtual field test and completeness of the test scenario are improved. In addition, the first signal transceiver assembly and the antenna probe are disposed inside the shielding cabinet, the shielding cabinet can prevent a signal outside the cabinet from entering the cabinet in a manner of a radio signal, and can prevent a signal inside the cabinet from being transmitted outside the cabinet in a manner of a radio signal, so that the antenna probe can receive, in a centralized manner, the signal transmitted by the antenna in package, and the signal transmitted by the antenna in package can be transmitted in the shielding cabinet in a centralized manner. Compared to the related art, an air interface for signal transmission can be formed by using real space of the shielding cabinet, to provide a condition for signal transmission in the shielding cabinet, so that the antenna probe can obtain, by using the real space, the signal transmitted by the antenna in package, and a coverage scenario of a signal on a real cell is simulated. Therefore, a problem that a signal cannot be introduced by using a feeder and a virtual field test cannot be performed on an antenna in package because a radio frequency port cannot be disposed on the antenna in package is resolved.

DETAILED DESCRIPTION OF ILLUSTRATIVE EMBODIMENTS

The following further describes the implementations of this application in detail with reference to the accompanying drawings.

In the related art, an antenna in package (AIP), an antenna probe, and a terminal are fixedly disposed in a virtual field. The antenna in package is configured to: obtain a signal of a baseband unit, and send the signal to the antenna probe. The antenna probe transmits the signal to the terminal by using a signal cable. In addition, a wireless network is tested by detecting the signal received by the terminal. However, when the wireless network is tested in the virtual field, neither the terminal nor the antenna in package can move, in other words, beam switching formed because the terminal and/or the antenna in package moves cannot be implemented. Consequently, a network transmission scenario formed, in a real network, because the antenna in package or the terminal moves cannot be simulated, and as a result, a test scenario is limited.

Figure 1:
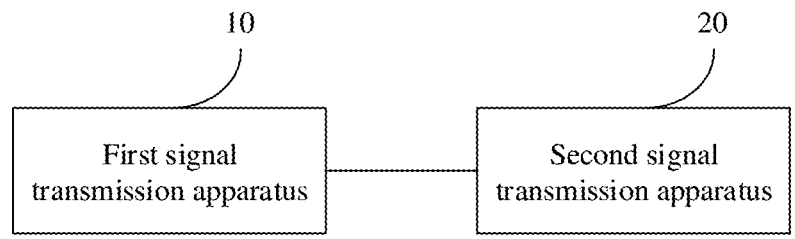
FIG. 1 is a schematic structural diagram of a signal transmission system according to an example embodiment of this application.

FIG. 1 is a schematic structural diagram of an application scenario according to an example embodiment of this application. The application scenario provides a signal transmission system. Referring to FIG. 1, the signal transmission system may include a first signal transmission apparatus 10 and a second signal transmission apparatus 20 that are connected by using a signal cable. The first signal transmission apparatus 10 may send a signal to the second signal transmission apparatus 20 by using the signal cable, or the second signal transmission apparatus 20 may send a signal to the first signal transmission apparatus 10 by using the signal cable, to help perform a KPI test on a network in a virtual field or perform gain evaluation on a performance feature of a network such as a multiple-input multiple-output (MIMO) system.

Figure 2:
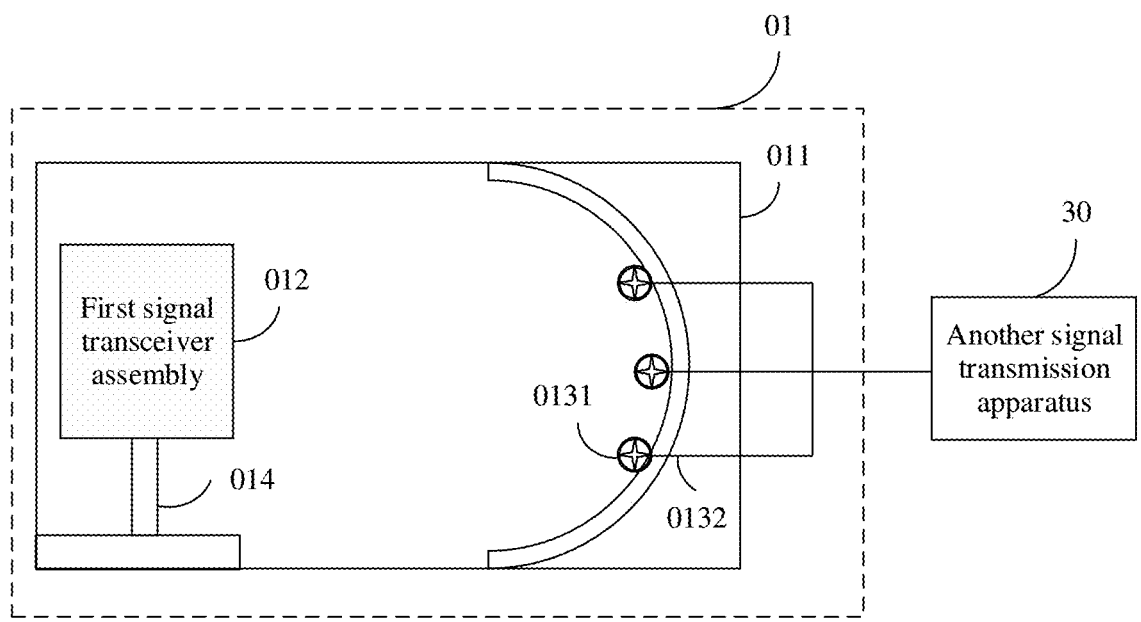
FIG. 2 is a schematic structural diagram of a signal transmission apparatus according to an example embodiment of this application.

An example embodiment of this application provides a signal transmission apparatus. The signal transmission apparatus may be applied to the first signal transmission apparatus 10 or the second signal transmission apparatus 20 in the application scenario shown in FIG. 1. As shown in FIG. 2, a signal transmission apparatus 01 may include: a shielding cabinet 011 and at least one group of first signal transceiver assemblies 012, at least one antenna assembly, and a first installation structure 014 that are disposed inside the shielding cabinet 011, where the first installation structure has a one-to-one correspondence with the at least one group of first signal transceiver assemblies 012, each antenna assembly includes an antenna probe 0131 and a signal cable 0132 that are connected to each other, and the antenna probe 0131 performs, by using the signal cable 0132, signal transmission with another signal transmission apparatus 30 disposed outside the shielding cabinet 011.

Signal transmission is performed between the first signal transceiver assembly 012 and the antenna probe 0131 in a wireless manner.

Each first installation structure 014 can drive a corresponding group of first signal transceiver assemblies 012 to move.

It should be noted that, when the first signal transceiver assembly 012 moves when driven by the first installation structure 014, strength and a phase of a signal received or sent by the first signal transceiver assembly 012 change correspondingly. Therefore, a scenario in which strength and a phase of a signal change because the first signal transceiver assembly 012 moves in a real network may be simulated, and a scenario in which the first signal transceiver assembly 012 performs beam switching in a cell and that is simulated due to a signal change is constructed, so that a plurality of scenarios may be provided for a virtual field test, and accuracy of the virtual field test and completeness of the test scenario are improved.

Figure 3A:
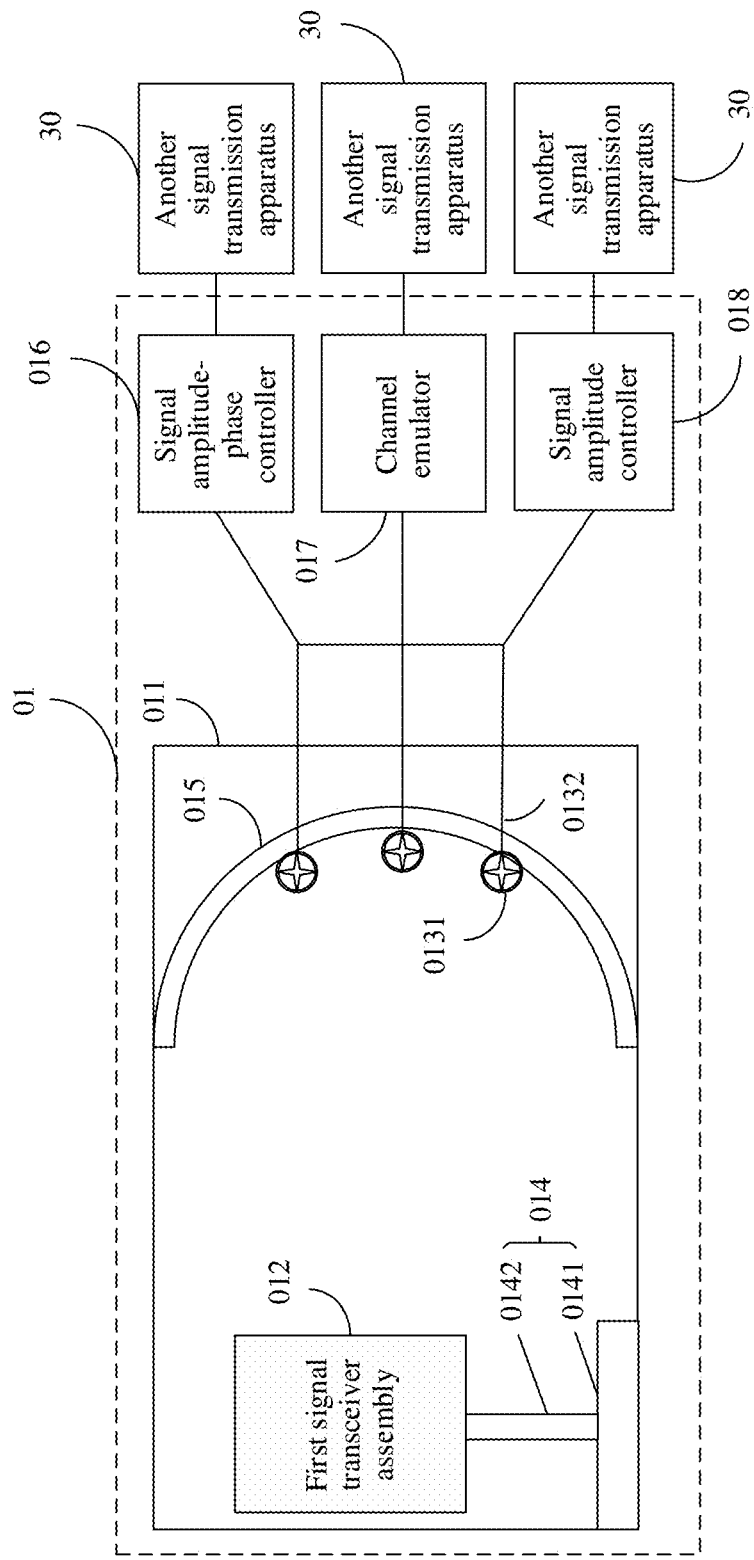
FIG. 3A is another schematic structural diagram of a signal transmission apparatus according to an example embodiment of this application.

Optionally, as shown in FIG. 3A, each first installation structure 014 may include a fixed piece 0141 and an active piece 0142. The fixed piece 0141 is fixedly connected to the shielding cabinet 011, one end of the active piece 0142 is actively connected to the fixed piece 0141, and the other end is fixedly connected to the corresponding group of first signal transceiver assemblies 012. In addition, the active piece 0142 can move horizontally, and/or the active piece 0142 can move vertically, and/or the active piece 0142 can rotate around a reference axis parallel to a vertical direction, and/or the active piece 0142 can rotate around a reference axis parallel to a horizontal direction.

In addition, when the first signal transceiver assembly 012 moves when driven by the first installation structure 014, to ensure that a relative position between the first signal transceiver assembly 012 and the antenna probe 0131 does not change as much as possible, the reference axis in the vertical direction may be a straight line that passes through a geometric center of the first signal transceiver assembly 012 in the vertical direction, and the reference axis in the horizontal direction may be a straight line that passes through the geometric center of the first signal transceiver assembly 012 in the horizontal direction. In addition, the reference axis may be a physical axis, or the reference axis may be a virtual axis.

In the related art, a signal of a baseband unit is generally sent to an antenna by a radio remote unit (RRU) connected to the baseband unit, to implement signal transmission. When an air interface test is performed in a virtual field, a feeder is usually connected to a radio frequency port of the RRU, to introduce a signal into the virtual field by using the feeder. However, after the RRU and the antenna are integrated into an antenna in package, a radio frequency port cannot be disposed on the antenna in package. Consequently, a signal cannot be introduced into the virtual field by using a feeder, and the antenna in package cannot perform a virtual field test. In the related art, a conversion panel is alternatively installed on an antenna in package to lead out a radio frequency port, to introduce a signal into the virtual field, however, this method cannot be applied to transmission of a high-frequency signal, and consequently, a signal cannot be introduced into the virtual field.

According to the signal transmission apparatus provided in this embodiment of this application, the first signal transceiver assembly 012 and the antenna probe 0131 are disposed inside the shielding cabinet 011, the shielding cabinet 011 can prevent a signal outside the cabinet from entering the cabinet in a manner of a radio signal, and can prevent a signal inside the cabinet from being transmitted outside the cabinet in a manner of a radio signal, so that when the signal is introduced into the virtual field by using the first signal transceiver assembly 012, the antenna probe 0131 can receive, in a centralized manner, a signal transmitted by the first signal transceiver assembly 012, and the signal transmitted by the first signal transceiver assembly 012 can be transmitted in the shielding cabinet 011 in a centralized manner. Compared to the related art, an air interface (that is, a virtual radio channel) for signal transmission can be formed by using real space of the shielding cabinet 011, to provide a condition for signal transmission in the shielding cabinet 011, so that the antenna probe 0131 can obtain, by using the real space, the signal transmitted by the first signal transceiver assembly 012, and send the signal to the another signal transmission apparatus 30 disposed outside the shielding cabinet 011. Further, a coverage scenario of a signal on a real cell is simulated, and signal introduction and transmission in the virtual field can be implemented without a radio frequency port. Therefore, a problem that a signal cannot be introduced by using a feeder and a virtual field test cannot be performed on an antenna in package because a radio frequency port cannot be disposed on the antenna in package is resolved.

Further, signal attenuation may occur in a transmission process of a signal, and an attenuation degree of the signal is positively correlated to a transmission distance. Therefore, to reduce impact of different attenuation degrees of signals on a test result, a distance from any antenna probe 0131 to any first signal transceiver assembly 012 may be within a preset distance range, so that a distance from each antenna probe 0131 to any first signal transceiver assembly 012 is equal as much as possible, and an attenuation degree of each signal in the transmission process is the same as much as possible, and therefore, the impact of signal attenuation degrees on the test result is reduced, to improve accuracy of the virtual field test.

Figure 3B:
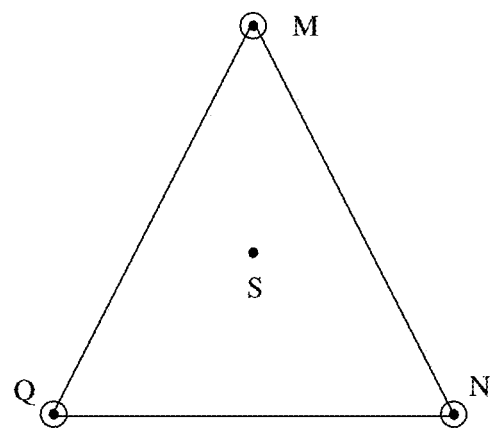
FIG. 3B is a schematic diagram of a geometric center of a graph enclosed by using installation points of three first signal transceiver assemblies in a signal transmission apparatus as vertices according to an example embodiment of this application.

Optionally, a distance from each antenna probe 0131 to a target point may be set equal, and the target point may be a geometric center of a graph enclosed by using an installation point of each of the at least one group of first signal transceiver assemblies 012 as a vertex, or the target point may be a specified reference point determined based on an actual requirement. For example, referring to FIG. 3B, installation points of three first signal transceiver assemblies (shown by circles in FIG. 3B) in the signal transmission apparatus are respectively located at a point M, a point N, and a point Q, a graph enclosed by using the point M, the point N, and the point Q as vertices is a triangle MNQ shown in FIG. 3B, and the target point may be located at a geometric center S of the triangle MNQ.

Figure 3C:
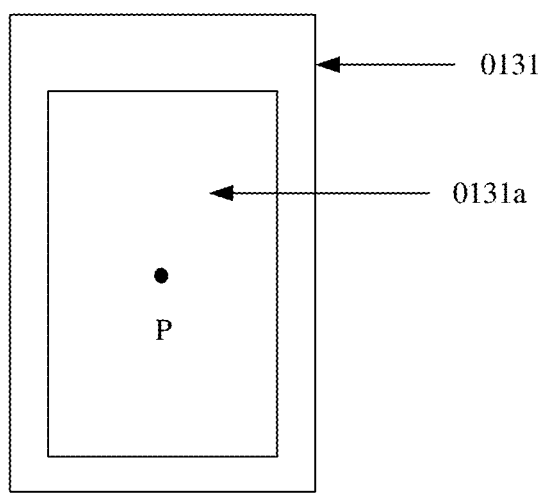
FIG. 3C is a schematic diagram of a probe center of an antenna probe according to an example embodiment of this application.

During actual application, each antenna probe 0131 has a probe center (the probe center is located at a geometric center of a component that is in the antenna probe and that is used to transmit a signal). For example, as shown in FIG. 3C, the probe center is located at a geometric center P of a component 0131*a* that is in the antenna probe 0131 and that is used to transmit a signal. Therefore, when the antenna probe is disposed, a distance from a probe center of each antenna probe 0131 to the target point is set equal.

In addition, as shown in FIG. 3A, the signal transmission apparatus may further include a second installation structure 015 disposed inside the shielding cabinet 011. The second installation structure 015 has an installation surface, and a distance from any point on the installation surface to the target point is equal, and each antenna probe 0131 is installed on the installation surface. When the distance from any point on the installation surface to the target point is equal, a signal attenuation degree of each signal in the transmission process can be further ensured to be the same as much as possible, to reduce the impact of the signal attenuation degrees on the test result.

Optionally, the installation surface may be a curved surface, and a generatrix of the curved surface is an arc that uses the target point as a circle center. In addition, a surface shape of the curved surface may be a sector or a rectangle. Alternatively, the installation surface may be a hemispherical surface, and a sphere center of the hemispherical surface is a position of the target point. In addition, referring to FIG. 3A, the second installation structure 015 may be an integrally formed structure whose installation surface is a curved surface or a spherical surface. Alternatively, referring to FIG. 4, the second installation structure 015 may be a structure that is formed by splicing a plurality of surfaces and whose installation surface is approximately a curved surface or a spherical surface as a whole. The plurality of surfaces may be of an irregular shape, for example, a triangle or a trapezoid.

During actual application, an actual structure of the first signal transmission apparatus 10 to which the signal transmission apparatus 01 is applied is different, so that an implementation scenario of the signal transmission apparatus 01 is different. For example, the following two implementation scenarios are used as examples.

In a first implementation scenario, the signal transmission apparatus 01 may be the first signal transmission apparatus 10 in FIG. 1, and the first signal transceiver assembly 012 of the signal transmission apparatus 01 may include at least one antenna in package. In this case, the another signal transmission apparatus 30 may be the second signal transmission apparatus 20 in FIG. 1, and includes a terminal or a spectrum analyzer.

The at least one antenna in package may be configured to: obtain an input signal (for example, the at least one antenna in package may obtain a signal of a baseband unit by using a connection to the baseband unit), and send the signal to the antenna probe 0131 in a wireless manner. The antenna probe 0131 sends the signal to the terminal or the spectrum analyzer by using the signal cable 0132. In this case, the signal received by the terminal or the spectrum analyzer may be detected, to test the signal transmitted by the antenna in package.

Further, when the first signal transceiver assembly 012 is an antenna in package, a size of the installation surface of the second installation structure 015 may be determined based on a signal coverage of the antenna in package and a distance between the installation surface and the antenna in package. For example, when the signal coverage of the antenna in package is 120 degrees in the horizontal direction and 60 degrees in the vertical direction, the size of the installation surface may be correspondingly set based on the signal coverage and the distance between the installation surface and the antenna in package, so that each antenna probe 0131 installed on the installation surface is within the signal coverage, to help each antenna probe 0131 to perform signal transmission with the antenna in package.

In a second implementation scenario, the signal transmission apparatus 01 may be the first signal transmission apparatus 10 in FIG. 1, and the first signal transceiver assembly 012 of the signal transmission apparatus 01 may include at least one terminal. In this case, the another signal transmission apparatus 30 is the second signal transmission apparatus 20 in FIG. 1, and may include an antenna in package. The terminal and the antenna in package may exchange signals by using the antenna probe 0131, and test a received signal at a receive end of the signal, to test a signal sent by a transmit end of the signal.

Optionally, the signal transmission apparatus may further include a first mobile assembly (not shown in FIG. 3A) having a one-to-one correspondence with the at least one antenna assembly, where one end of each first mobile assembly is connected to the second installation structure 015, the other end of each first mobile assembly is connected to a corresponding antenna probe 0131, and each first mobile assembly is configured to drive the corresponding antenna probe 0131 to move relative to the second installation structure 015, to help adjust, in a test process, a position of the antenna probe 0131 based on an actual requirement.

In a possible implementation of the first mobile assembly, each first mobile assembly may be a connecting rod assembly or a rocker arm assembly. For example, when the first mobile assembly is the connecting rod assembly, when the position of the antenna probe 0131 needs to be adjusted, the antenna probe 0131 may be moved to a target position by changing a stretching state of a connecting rod in the connecting rod assembly.

In another possible implementation of the first mobile assembly, each first mobile assembly may include a sliding guide rail and a sliding portion. The sliding guide rail is fixedly connected to the second installation structure 015, one end of the sliding portion is clamped into the sliding guide rail, and the other end of the sliding portion is fixedly connected to a corresponding antenna probe 0131. For example, the sliding guide rail may be mesh-shaped. When the position of the antenna probe 0131 needs to be adjusted, the sliding portion may be pushed to slide in the mesh-shaped sliding guide rail, so that the sliding portion slides to a target position, and the antenna probe 0131 is driven by the sliding portion to move to a corresponding position.

Optionally, the signal transmission apparatus may further include a second mobile assembly (not shown in FIG. 3A). One end of the second mobile assembly is connected to the second installation structure 015, the other end of the second mobile assembly is connected to the shielding cabinet 011, and the second mobile assembly is configured to drive the second installation structure 015 to move in the shielding cabinet 011, and therefore, each antenna probe 0131 on the installation surface of the second installation structure 015 is driven to move to a corresponding position.

A signal received by the antenna probe 0131 has a signal amplitude and a signal phase, and the antenna probe 0131 is configured to perform, by using the signal cable 0132, signal transmission with the another signal transmission apparatus 30 disposed outside the shielding cabinet 011. Therefore, the position of the antenna probe 0131 can reflect a position of the another signal transmission apparatus 30 in the network. Correspondingly, by adjusting the position of the antenna probe 0131 by using the first mobile assembly and the second mobile assembly, a beam switching scenario formed, in the real network, because the another signal transmission apparatus 30 moves can be simulated. Therefore, in an actual test process, for example, when the real network is analyzed or modeled, or when a function implemented by a product such as an antenna in package is analyzed, the position of the antenna probe 0131 may be adjusted based on test content, to simulate the beam switching scenario, and the completeness of the virtual field test scenario is improved.

During actual application, an antenna probe required for the test may alternatively be selected from the at least one antenna probe 0131 based on test content, to obtain a signal required for the test. For example, 200 antenna probes may be disposed in the signal transmission apparatus 01, and the 200 antenna probes are respectively a first antenna probe, a second antenna probe, . . . , a 199th antenna probe, and a 200th antenna probe. In a process of a test, the first antenna probe, the second antenna probe, the third antenna probe, and the fourth antenna probe may be selected to turn on, and other antenna probes are turned off, to obtain a signal required for the test. In a process of another test, the first antenna probe, the second antenna probe, the third antenna probe, and the fifth antenna probe may be selected to turn on, and other antenna probes are turned off, to obtain a signal required for the another test.

Further, when the first signal transceiver assembly 012 includes at least one antenna in package, each group of first signal transceiver assemblies 012 may include three antennas in package. When the first installation structure 014 drives the three antennas in package to move, and the antenna in package is configured to send a signal to the antenna probe 0131, strength and a phase of the signal sent by the antenna in package change, so that a scenario in which a signal is handed over between cells due to a signal change may be constructed, and a plurality of scenarios are provided for the virtual field test.

In addition, because a signal coverage of each antenna in package is limited, when the first signal transceiver assembly 012 includes three antennas in package, a signal coverage of the antennas in package in the first signal transceiver assembly 012 can be correspondingly increased, to increase a range of a signal can be received by the another signal transmission apparatus 30.

For example, it is assumed that when a signal coverage of each antenna in package is 120 degrees in the horizontal direction and 60 degrees in the vertical direction and each group of first signal transceiver assemblies 012 includes three antennas in package, a signal coverage of the antennas in package in the group of first signal transceiver assemblies 012 may reach a coverage of 360 degrees in the horizontal direction and 60 degrees in the vertical direction. Therefore, in a process in which the corresponding group of first signal transceiver assemblies 012 rotates in the horizontal direction when driven by the active piece 0142, the another signal transmission apparatus 30 may continuously receive a signal from the antennas in package included in the group of first signal transceiver assemblies 012, in other words, the range of the signal can be received by the another signal transmission apparatus 30 is increased.

In an example embodiment of this application, each antenna probe 0131 may be any one of a directional dual-polarized antenna, a directional single-polarized antenna, an omnidirectional dual-polarized antenna, or an omnidirectional single-polarized antenna. When the antenna probe 0131 is a dual-polarized antenna, two antennas, in the antenna, whose polarization directions are mutually orthogonal can simultaneously work in a transmit/receive duplex mode, so that a quantity of antennas disposed in the signal transmission apparatus can be reduced.

Optionally, a signal processing assembly may be further serially connected to each signal cable 0132, and the signal processing assembly may be disposed inside the shielding cabinet 011, or may be disposed outside the shielding cabinet 011. As shown in FIG. 3A, the signal processing assembly may be a signal amplitude-phase controller 016, a channel emulator 017, or a signal amplitude controller 018. The signal amplitude-phase controller 016 serially connected to each signal cable 0132 is configured to adjust an amplitude and a phase of a signal transmitted on the signal cable 0132. The channel emulator 017 serially connected to each signal cable 0132 is configured to configure a channel parameter of a signal transmitted on the signal cable 0132. The signal amplitude controller 018 serially connected to each signal cable 0132 is configured to adjust an amplitude of a signal transmitted on the signal cable 0132. The channel parameter may be a parameter such as a channel capacity, a channel bandwidth, a transmission path, or an attenuation degree.

During actual application, a function of the signal amplitude-phase controller may be implemented by using an amplitude-phase change matrix, and a function of the signal amplitude controller may be implemented by using a next generation virtual attenuation matrix (Next Generation Virtual attenuation Matrix, NG-VAM). For example, for a schematic diagram of a connection between the amplitude-phase change matrix 016a and the signal transmission apparatus 01 and a connection between the channel emulator 017 and the signal transmission apparatus 01, refer to FIG. 4. The amplitude-phase change matrix 016a is connected to a plurality of signal cables 0132, and is configured to adjust amplitudes and phases of signals transmitted on the plurality of signal cables 0132. The channel emulator 017 is connected to another plurality of signal cables 0132, and is configured to configure channel parameters of signals transmitted on the plurality of signal cables 0132. The plurality of signal cables 0132 connected to the amplitude-phase change matrix 016a and the another plurality of signal cables 0132 connected to the channel emulator 017 are different signal cables 0132. A signal output from the amplitude-phase change matrix 016a is input into one of the another signal transmission apparatuses 30, and a signal output from the channel emulator 017 is input into another one of the another signal transmission apparatuses 30.

Processing a signal by using the signal processing assembly can simulate a change of a signal in a real transmission process, so that a signal received by the another signal transmission apparatus 30 is closer to the signal in the real transmission process, and a similarity between the signal and a signal in an actual mobile communications network is improved, to further improve accuracy of the virtual field test. For example, in the foregoing first implementation scenario, when the another signal transmission apparatus 30 includes the terminal, the signal processing assembly is used to adjust an amplitude and/or a phase of a signal, so that an effect, on a signal received by the terminal, obtained after an amplitude difference or a phase difference between antennas in the terminal is adjusted can be simulated, the signal received by the terminal is closer to a signal in an actual transmission process, and a similarity between the signal and a signal in an actual mobile communications network is improved.

Optionally, a wave-absorbing material may be further coated inside the shielding cabinet 011, and the wave-absorbing material has, in a relatively wide frequency band, a high absorption rate for an electromagnetic wave, the wave-absorbing material may be a carbon wave-absorbing material, an iron wave-absorbing material, a ceramic wave-absorbing material, or another type of material. For example, the carbon wave-absorbing material may be a material such as graphene, graphite, carbon black, carbon fiber, or a carbon nanotube. The iron wave-absorbing material may be ferrite or a magnetic iron nano-material. The ceramic wave-absorbing material may be a material such as silicon carbide. The another type of material may be a conductive polymer, a chiral material, a plasma material, or the like. This is not specifically limited in this embodiment of this application.

When a signal is transmitted to an inner wall of the shielding cabinet 011, if the signal is reflected by the inner wall, the reflected signal causes interference to another signal transmitted inside the shielding cabinet 011, for example, causes interference to a signal that is transmitted inside the shielding cabinet 011 and that is used for testing. Therefore, the wave-absorbing material is coated inside the shielding cabinet 011, and a signal transmitted to the inner wall of the shielding cabinet 011 is absorbed by using the wave-absorbing material, so that the signal transmitted to the inner wall may be prevented from being reflected, and a quality of the signal transmitted inside the shielding cabinet is ensured.

In conclusion, according to the signal transmission apparatus provided in this embodiment of this application, the first installation structure drives the corresponding group of first signal transceiver assemblies to move, so that strength and a phase of a signal received or sent by the first signal transceiver assembly change correspondingly. Therefore, a scenario in which strength and a phase of a signal change because the first signal transceiver assembly moves in a real network is simulated, and a scenario in which the first signal transceiver assembly performs beam switching in a cell and that is simulated due to a signal change is constructed, so that a plurality of scenarios may be provided for the virtual field test, and accuracy of the virtual field test and completeness of the test scenario are improved. In addition, the first signal transceiver assembly and the antenna probe are disposed inside the shielding cabinet, the shielding cabinet can prevent a signal outside the cabinet from entering the cabinet in a manner of a radio signal, and can prevent a signal inside the cabinet from being transmitted outside the cabinet in a manner of a radio signal, so that the antenna probe can receive, in a centralized manner, the signal transmitted by the antenna in package, and the signal transmitted by the antenna in package can be transmitted in the shielding cabinet in a centralized manner. Compared to the related art, an air interface for signal transmission can be formed by using real space of the shielding cabinet, to provide a condition for signal transmission in the shielding cabinet, so that the antenna probe can obtain, by using the real space, the signal transmitted by the antenna in package, and coverage of a signal on a real cell is simulated. Therefore, a problem that a signal cannot be introduced by using a feeder and a virtual field test cannot be performed on an antenna in package because a radio frequency port cannot be disposed on the antenna in package is resolved.

An example embodiment of this application further provides a signal transmission system. A structure of the signal transmission system may be shown in FIG. 1. The signal transmission system may include the signal transmission apparatus 01 in the foregoing embodiment.

Optionally, the signal transmission system may include a first signal transmission apparatus 10. A structure of the first signal transmission apparatus 10 may be the same as a structure of the signal transmission apparatus 01 shown in any one of FIG. 2 to FIG. 4, and a first signal transceiver assembly in the first signal transmission apparatus 10 includes at least one antenna in package.

Optionally, to implement a virtual field scenario, as shown in FIG. 1, the signal transmission system may further include a second signal transmission apparatus 20, to exchange signals between the first signal transmission apparatus 10 and the second signal transmission apparatus 20. The second signal transmission apparatus 20 may have a plurality of forms. In this embodiment of the present invention, the following two forms are used as examples for description.

In the first form, the second signal transmission apparatus 20 may be a terminal or a spectrum analyzer.

In this case, for a structure of the signal transmission system, refer to FIG. 2. For a connection relationship and a signal transmission principle between the first signal transmission apparatus 10 and the second signal transmission apparatus 20, refer to a connection relationship and a signal transmission principle between the signal transmission apparatus 01 and the another signal transmission apparatus 30 in FIG. 2.

When the second signal transmission apparatus 20 is the terminal, the at least one antenna in package of the first signal transmission apparatus 10 may exchange signals with the terminal, and test a received signal at a receive end of the signal. For example, when the at least one antenna in package in the first signal transmission apparatus sends a signal to an antenna probe, and the antenna probe sends the signal to the terminal by using a signal cable, the signal received by the terminal may be detected, to test the signal sent by the antenna in package. When the terminal sends a signal to the antenna probe, and the antenna probe sends the signal to the at least one antenna in package in the first signal transmission apparatus, the signal received by the antenna in package may be detected, to test the signal sent by the terminal.

When the second signal transmission apparatus 20 is a spectrum analyzer, the at least one antenna in package of the first signal transmission apparatus 10 may send a signal to the antenna probe, and when the antenna probe sends the signal to the terminal by using a signal cable, the signal received by the spectrum analyzer may be detected, to test the signal sent by the antenna in package.

It should be noted that the second signal transmission apparatus 20 may be connected to the signal cable in the first signal transmission apparatus 10 in a manner shown in FIG. 2, or each second signal transmission apparatus 20 may be connected only to one signal cable in the first signal transmission apparatus 10, or a plurality of second signal transmission apparatuses 20 may be connected to a same signal cable in the first signal transmission apparatus 10. This is not specifically limited in this example embodiment of this application.

Figure 4:
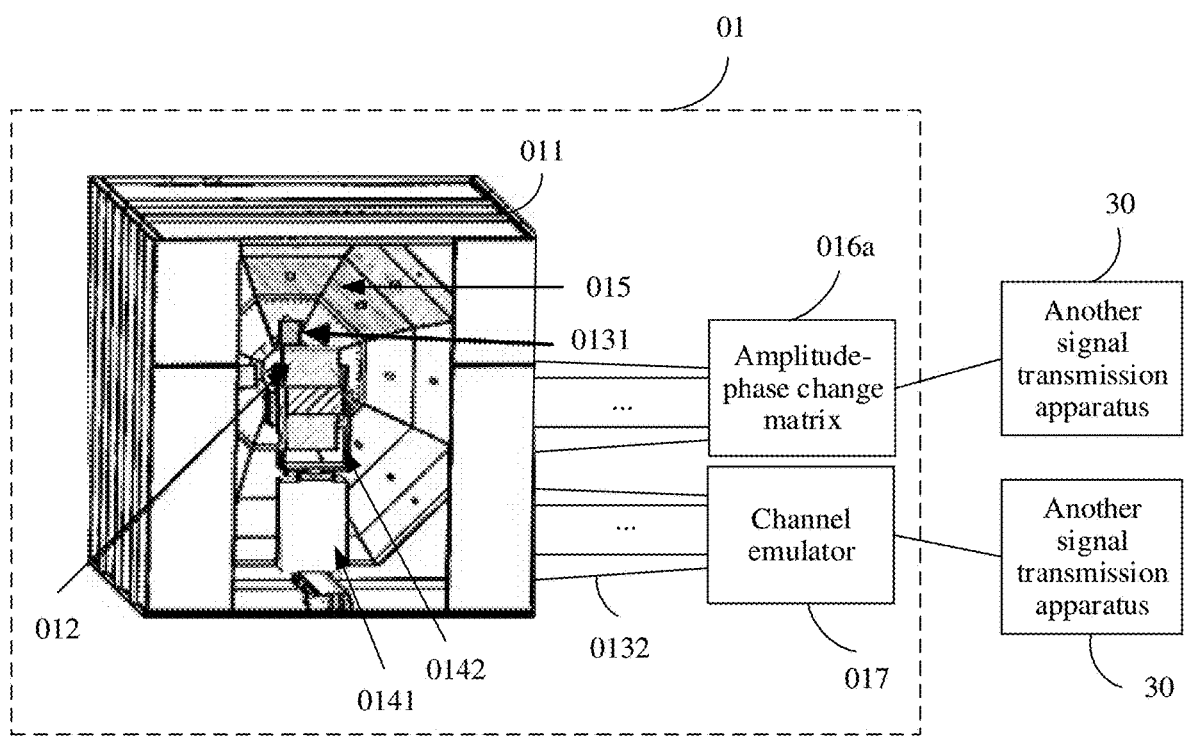
FIG. 4 is still another schematic structural diagram of a signal transmission apparatus according to an example embodiment of this application.

In the second form, a structure of the second signal transmission apparatus 20 may be the same as a structure of the signal transmission apparatus 01 shown in any one of FIG. 2 to FIG. 4, and a first signal transceiver assembly in the second signal transmission apparatus 20 includes at least one terminal.

In this case, for a connection relationship and a signal transmission principle between the first signal transmission apparatus 10 and the second signal transmission apparatus 20, refer to a connection relationship and a signal transmission principle between the signal transmission apparatus 01 and the another signal transmission apparatus 30 in FIG. 2. In addition, at least one antenna in package of the first signal transmission apparatus 10 may exchange signals with the terminal in the second signal transmission apparatus 20, and test a received signal at a receive end of the signal.

Figure 5:
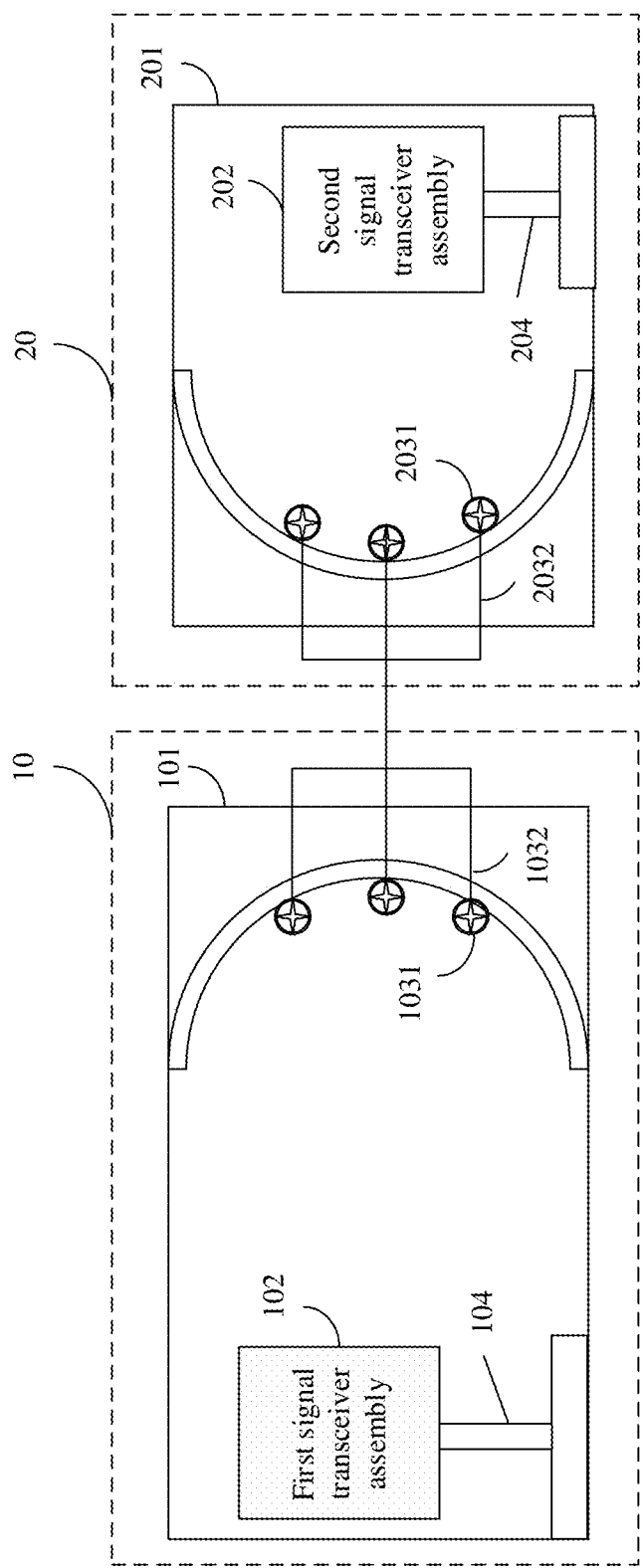
FIG. 5 is a schematic structural diagram of another signal transmission apparatus according to an example embodiment of this application.

For example, for a structure of the signal transmission system, refer to FIG. 5. As shown in FIG. 5, the first signal transmission apparatus 10 includes: a shielding cabinet 101 and assemblies such as at least one group of first signal transceiver assemblies 102, at least one antenna assembly, and a first installation structure 104 that are disposed inside the shielding cabinet 101, where the first installation structure 104 has a one-to-one correspondence with the at least one group of first signal transceiver assemblies 102, and each antenna assembly includes an antenna probe 1031 and a signal cable 1032 that are connected to each other; and the second signal transmission apparatus 20 includes: a second shielding cabinet 201 and assemblies such as at least one group of second signal transceiver assemblies 202, at least one second antenna assembly, and a third installation structure 204 that are disposed inside the second shielding cabinet 201, where the third installation structure 204 has a one-to-one correspondence with the at least one group of second signal transceiver assemblies 202, and each second antenna assembly includes a second antenna probe 2031 and a second signal cable 2032 that are connected to each other.

It should be noted that a connection mode between signal cables in the plurality of antenna assemblies in the first signal transmission apparatus 10 and antenna probes (or signal cables) in the plurality of antenna assemblies in the second signal transmission apparatus 20 may be adjusted based on an actual requirement. For example, each antenna probe (or signal cable) in the second signal transmission apparatus 20 may be connected only to one signal cable in the first signal transmission apparatus 10, or each antenna probe (or signal cable) in the second signal transmission apparatus 20 may be connected to a plurality of signal cables in the first signal transmission apparatus 10, or a plurality of antenna probes (or signal cables) in the second signal transmission apparatus 20 may be connected to a same signal cable in the first signal transmission apparatus 10.

It should be noted that at least one terminal or a spectrum analyzer may alternatively be disposed in the second signal transmission apparatus. Further, when a plurality of terminals or a spectrum analyzer are disposed in the second signal transmission apparatus 20, signals may be received by using the plurality of terminals or the spectrum analyzer. In addition, the plurality of received signals are tested, and accuracy of the test is improved.

In conclusion, according to the signal transmission system provided in this embodiment of this application, the first installation structure drives the corresponding group of first signal transceiver assemblies to move, so that strength and a phase of a signal received or sent by the first signal transceiver assembly change correspondingly. Therefore, a scenario in which strength and a phase of a signal change because the first signal transceiver assembly moves in a real network may be simulated, and a scenario in which the first signal transceiver assembly performs beam switching in a cell and that is simulated due to a signal change is constructed, so that a plurality of scenarios may be provided for the virtual field test, and accuracy of the virtual field test and completeness of the test scenario are improved. In addition, the first signal transceiver assembly and the antenna probe are disposed inside the shielding cabinet, the shielding cabinet can prevent a signal outside the cabinet from entering the cabinet in a manner of a radio signal, and can prevent a signal inside the cabinet from being transmitted outside the cabinet in a manner of a radio signal, so that the antenna probe can receive, in a centralized manner, the signal transmitted by the antenna in package, and the signal transmitted by the antenna in package can be transmitted in the shielding cabinet in a centralized manner. Compared to the related art, an air interface for signal transmission can be formed by using real space of the shielding cabinet, to provide a condition for signal transmission in the shielding cabinet, so that the antenna probe can obtain, by using the real space, the signal transmitted by the antenna in package, and coverage of a signal on a real cell is simulated. Therefore, a problem that a signal cannot be introduced by using a feeder and a virtual field test cannot be performed on an antenna in package because a radio frequency port cannot be disposed on the antenna in package is resolved.

It should be noted that the signal transmission apparatus and system provided in the example embodiments of this application are not only applicable to a high-frequency antenna in package module without a radio frequency port in 5G, but also applicable to another signal transmission scenario. This is not specifically limited in the example embodiments of this application. For example, the signal transmission apparatus and system can also be applicable to an antenna or an active antenna unit (AAU) in a standard such as time division duplexing (TDD) or frequency division duplexing (FDD).

A person of ordinary skill in the art may understand that all or some of the steps of the embodiments may be implemented by hardware or a program instructing related hardware. The program may be stored in a computer-readable storage medium. The storage medium may include: a read-only memory, a magnetic disk, or an optical disc.

The foregoing descriptions are merely example embodiments of the present invention, but are not intended to limit the present invention. Any modification, equivalent replacement, and improvement made without departing from the principle of the present invention shall fall within the protection scope of the present invention.

What is claimed is:

1. An apparatus, comprising:
   a shielding cabinet;
   at least one group of first signal transceiver assemblies disposed inside the shielding cabinet;
   at least one antenna assembly disposed inside the shielding cabinet, and
   at least one first installation structure disposed inside the shielding cabinet, wherein the at least one first installation structure has a one-to-one correspondence with the at least one group of first signal transceiver assemblies;
   wherein each of the at least one antenna assembly comprises a respective antenna probe and a respective signal cable that are connected to each other, and the respective antenna probe performs signal transmission with another signal transmission apparatus disposed outside the shielding cabinet through the respective signal cable;

wherein signal transmission is performed between the at least one group of first signal transceiver assemblies and each antenna probe of the at least one antenna assembly in a wireless manner; and wherein each of the at least one first installation structure drives a corresponding signal transceiver assembly of the at least one group of first signal transceiver assemblies to move.

2. The apparatus according to claim 1, wherein each of the at least one first installation structure comprises a respective fixed piece and a respective active piece, the respective fixed piece is fixedly connected to the shielding cabinet, one end of the respective active piece is actively connected to the respective fixed piece, and another end is fixedly connected to the corresponding signal transceiver assembly of the at least one group of first signal transceiver assemblies, and wherein:

the respective active piece moves horizontally;
the respective active piece moves vertically;
the respective active piece rotates around a reference axis parallel to a vertical direction; or
the respective active piece rotates around a reference axis parallel to a horizontal direction.

3. The apparatus according to claim 1, wherein:
a distance from any antenna probe of the at least one antenna assembly to any first signal transceiver assembly of the at least one group of first signal transceiver assemblies is within a preset distance range.

4. The apparatus according to claim 3, wherein
a respective distance from each antenna probe of the at least one antenna assembly to a target point is constant, and the target point is a geometric center of a graph with a respective installation point of each of the at least one group of first signal transceiver assemblies as a vertex.

5. The apparatus according to claim 4, further comprising:
a second installation structure disposed inside the shielding cabinet, wherein the second installation structure has an installation surface, a distance from any point on the installation surface to the target point is constant, and each antenna probe of the at least one antenna assembly is installed on the installation surface.

6. The signal transmission apparatus according to claim 5, wherein:
the installation surface is a curved surface, and a generatrix of the curved surface is an arc having the target point as a circle center.

7. The apparatus according to claim 5, wherein:
the installation surface is a hemispherical surface, and a sphere center of the hemispherical surface is the target point.

8. The apparatus according to claim 5, further comprising:
at least one first mobile assembly having a one-to-one correspondence with the at least one antenna assembly, wherein one end of each of the at least one first mobile assembly is connected to the second installation structure, another end of each of the at least one first mobile assembly is connected to a corresponding antenna probe of the at least one antenna assembly, and each of the at least one first mobile assembly is configured to drive the corresponding antenna probe of the at least one antenna assembly to move relative to the second installation structure.

9. The apparatus according to claim 8, wherein:
each of the at least one first mobile assembly is a connecting rod assembly or a rocker arm assembly.

10. The apparatus according to claim 8, wherein each of the at least one first mobile assembly comprises a respective sliding guide rail and a respective sliding portion, the respective sliding guide rail is fixedly connected to the second installation structure, one end of the respective sliding portion is clamped into the respective sliding guide rail, and another end of the respective sliding portion is fixedly connected to the corresponding antenna probe of the at least one antenna assembly.

11. The apparatus according to claim 5, further comprising a second mobile assembly, one end of the second mobile assembly is connected to the second installation structure, another end of the second mobile assembly is connected to the shielding cabinet, and the second mobile assembly is configured to drive the second installation structure to move within the shielding cabinet.

12. The apparatus according to claim 1, wherein each antenna probe of the at least one antenna assembly is any one of a directional dual-polarized antenna, a directional single-polarized antenna, an omnidirectional dual-polarized antenna, or an omnidirectional single-polarized antenna.

13. The apparatus according to claim 1, wherein a signal processing assembly is serially connected to the respective signal cable of each of the at least one antenna assembly.

14. The apparatus according to claim 13, wherein:
the signal processing assembly is a signal amplitude-phase controller, a channel emulator, or a signal amplitude controller;
the signal amplitude-phase controller is configured to adjust an amplitude and a phase of a signal transmitted on the respective signal cable;
the channel emulator serially is configured to configure a channel parameter of a signal transmitted on the respective signal cable; and
the signal amplitude controller serially is configured to adjust an amplitude of a signal transmitted on the respective signal cable.

15. The apparatus according to claim 1, wherein an inside of the shielding cabinet is coated with a wave absorbing material.

16. The signal transmission apparatus according to claim 1, wherein the at least one group of first signal transceiver assemblies comprises at least one antenna in package, and the another signal transmission apparatus comprises a terminal or a spectrum analyzer.

17. The signal transmission apparatus according to claim 16, wherein each of the at least one group of first signal transceiver assemblies comprises three antennas in package.

18. The apparatus according to claim 1, wherein the at least one group of first signal transceiver assemblies comprises at least one terminal, and the another signal transmission apparatus comprises an antenna in package.

* * * * *